(12) United States Patent
Carella et al.

(10) Patent No.: US 11,338,558 B2
(45) Date of Patent: May 24, 2022

(54) MULTILAYER ASSEMBLY

(71) Applicant: SOLVAY SPECIALTY POLYMERS ITALY S.P.A., Bollate (IT)

(72) Inventors: Serena Carella, Parabiago (IT); Mattia Bassi, Milan (IT); Stefano Mortara, Arconate (IT); Paolo Toniolo, Cesate (IT); Julio A. Abusleme, Saronno (IT)

(73) Assignee: SOLVAY SPECIALTY POLYMERS ITALY S.P.A., Bollate (IT)

( * ) Notice: Subject to any disclaimer, the term of this patent is extended or adjusted under 35 U.S.C. 154(b) by 143 days.

(21) Appl. No.: 16/525,178

(22) Filed: Jul. 29, 2019

(65) Prior Publication Data

US 2019/0351658 A1    Nov. 21, 2019

Related U.S. Application Data

(63) Continuation of application No. 13/877,792, filed as application No. PCT/EP2011/067763 on Oct. 12, 2011, now abandoned.

(30) Foreign Application Priority Data

Oct. 15, 2010 (EP) .................................... 10187732
Apr. 12, 2011 (EP) .................................... 11162130

(51) Int. Cl.
*B32B 27/08* (2006.01)
*B32B 27/30* (2006.01)
(Continued)

(52) U.S. Cl.
CPC .............. *B32B 27/08* (2013.01); *B32B 27/20* (2013.01); *B32B 27/304* (2013.01);
(Continued)

(58) Field of Classification Search
None
See application file for complete search history.

(56) References Cited

U.S. PATENT DOCUMENTS 2,392,378 A * 1/1946 Hanford .............. C08F 214/245
526/232.1
5,614,319 A 3/1997 Wessels et al.
(Continued)

FOREIGN PATENT DOCUMENTS

EP     0 683 204 B1 *  3/1999
EP     1281730 A2      2/2003
(Continued)

OTHER PUBLICATIONS

"HALAR ECTFE—Ethylene-Chlorotrifluoroethylene—Typical Properties" (Solvay Solexis), 2006. (Year: 2006).*

*Primary Examiner* — Vivian Chen
(74) *Attorney, Agent, or Firm* — Osha Bergman Watanabe & Burton LLP

(57) ABSTRACT

The invention pertains to a multilayer assembly comprising:
(L1) a first inner layer [layer (L1)] made from a first composition [composition (C1)], said composition (C1) comprising:
at least one polymer comprising recurring units derived from ethylene (E) and from chlorotrifluoroethylene (CTFE), and
at least one Ti compound; and
(L2) a second outer layer [layer (L2)] made from a second composition [composition (C2)], said composition (C2) being substantially free from TiO$_2$-containing additives, said second composition comprising at least one semi-crystalline polymer comprising recurring units derived from ethylene and from at least one fluoromonomer selected from chlorotrifluoroethylene (CTFE), tetrafluo-
(Continued)

roethylene (TFE) and mixtures thereof, said semi-crystalline polymer having a heat of fusion of at least 35 J/g [polymer (A)].

11 Claims, 1 Drawing Sheet

(51) Int. Cl.
| | | |
|---|---|---|
| B32B 27/20 | (2006.01) | |
| H01L 31/048 | (2014.01) | |
| B32B 7/02 | (2019.01) | |
| B32B 37/16 | (2006.01) | |
| B32B 7/12 | (2006.01) | |
| B32B 27/36 | (2006.01) | |
| B32B 37/15 | (2006.01) | |
| B32B 37/12 | (2006.01) | |
| B32B 27/18 | (2006.01) | |
| B32B 27/32 | (2006.01) | |
| B32B 7/027 | (2019.01) | |
| C08F 214/24 | (2006.01) | |
| C08F 214/18 | (2006.01) | |
| C08L 27/12 | (2006.01) | |
| C08F 10/02 | (2006.01) | |
| C08F 14/24 | (2006.01) | |
| C08L 23/08 | (2006.01) | |
| B29K 27/12 | (2006.01) | |
| H01L 31/049 | (2014.01) | |
| B29K 23/00 | (2006.01) | |
| C08J 5/18 | (2006.01) | |
| C08K 3/36 | (2006.01) | |
| C08K 3/22 | (2006.01) | |
| C08K 3/014 | (2018.01) | |

(52) U.S. Cl.
CPC ...... *H01L 31/0481* (2013.01); *B29K 2023/08* (2013.01); *B29K 2027/12* (2013.01); *B32B 7/02* (2013.01); *B32B 7/027* (2019.01); *B32B 7/12* (2013.01); *B32B 27/18* (2013.01); *B32B 27/32* (2013.01); *B32B 27/322* (2013.01); *B32B 27/36* (2013.01); *B32B 37/12* (2013.01); *B32B 37/15* (2013.01); *B32B 37/153* (2013.01); *B32B 37/16* (2013.01); *B32B 2250/02* (2013.01); *B32B 2250/03* (2013.01); *B32B 2250/24* (2013.01); *B32B 2250/246* (2013.01); *B32B 2250/40* (2013.01); *B32B 2264/102* (2013.01); *B32B 2264/1021* (2020.08); *B32B 2264/1022* (2020.08); *B32B 2264/1023* (2020.08); *B32B 2307/30* (2013.01); *B32B 2307/306* (2013.01); *B32B 2307/412* (2013.01); *B32B 2307/704* (2013.01); *B32B 2307/71* (2013.01); *B32B 2307/712* (2013.01); *B32B 2307/7242* (2013.01); *B32B 2323/00* (2013.01); *B32B 2327/12* (2013.01); *B32B 2367/00* (2013.01); *B32B 2439/70* (2013.01); *B32B 2439/80* (2013.01); *B32B 2457/12* (2013.01); *C08F 10/02* (2013.01); *C08F 14/24* (2013.01); *C08F 214/186* (2013.01); *C08F 214/24* (2013.01); *C08F 214/245* (2013.01); *C08J 5/18* (2013.01); *C08J 2323/08* (2013.01); *C08J 2327/12* (2013.01); *C08K 3/014* (2018.01); *C08K 3/36* (2013.01); *C08K 2003/2227* (2013.01); *C08K 2003/2241* (2013.01); *C08L 23/0846* (2013.01); *C08L 23/0892* (2013.01); *C08L 27/12* (2013.01); *H01L 31/048* (2013.01); *H01L 31/049* (2014.12); *Y02E 10/50* (2013.01); *Y10T 156/10* (2015.01); *Y10T 428/13* (2015.01); *Y10T 428/1334* (2015.01); *Y10T 428/1341* (2015.01); *Y10T 428/1379* (2015.01); *Y10T 428/257* (2015.01); *Y10T 428/259* (2015.01); *Y10T 428/265* (2015.01); *Y10T 428/3154* (2015.04); *Y10T 428/31544* (2015.04); *Y10T 428/31786* (2015.04); *Y10T 428/31935* (2015.04)

(56) References Cited

U.S. PATENT DOCUMENTS

| | | | |
|---|---|---|---|
| 5,962,610 A * | 10/1999 | Abusleme | C08F 214/186 |
| | | | 526/206 |
| 6,706,351 B2 | 3/2004 | Abusleme et al. | |
| 7,381,463 B2 | 6/2008 | Abusleme et al. | |
| 9,441,087 B2 * | 9/2016 | Carella | C08K 3/014 |
| 10,082,236 B2 * | 9/2018 | Carella | F16L 58/1072 |
| 10,155,857 B2 * | 12/2018 | Carella | C08J 5/18 |
| 2005/0186433 A1 | 8/2005 | Hetzler et al. | |
| 2005/0268961 A1 | 12/2005 | Hetzler et al. | |
| 2006/0116279 A1 | 6/2006 | Kogoi et al. | |
| 2007/0017567 A1 | 1/2007 | Gronet et al. | |
| 2008/0280142 A1 | 11/2008 | Birmingham et al. | |
| 2009/0162652 A1 | 6/2009 | Ranade et al. | |
| 2010/0092759 A1 | 4/2010 | Fan et al. | |
| 2010/0151180 A1 | 6/2010 | Bravet et al. | |
| 2011/0232735 A1 | 9/2011 | Bizet et al. | |
| 2019/0127567 A1 * | 5/2019 | Carella | H01B 13/148 |

FOREIGN PATENT DOCUMENTS

| | | |
|---|---|---|
| FR | 2 927 016 A1 | 8/2009 |
| JP | 62121032 A | 6/1987 |
| JP | 06090627 A | 4/1994 |
| JP | 09288914 A | 11/1997 |
| JP | 2004283699 A | 10/2004 |
| WO | 2009101343 A1 | 8/2009 |

\* cited by examiner

MULTILAYER ASSEMBLY

CROSS-REFERENCE TO RELATED APPLICATIONS

This application is a continuation of U.S. Ser. No. 13/877,792, filed Apr. 4, 2013, abandoned, which is a U.S. national stage entry under 35 U.S.C. § 371 of International Application No. PCT/EP2011/067763 filed Oct. 12, 2011, which claims priority to European applications No. EP 10187732.2 filed on Oct. 15, 2010 and EP 11162130.6 filed on Apr. 12, 2011. The entire contents of these applications are explicitly incorporated herein by this reference.

TECHNICAL FIELD

The invention pertains to multilayer assemblies comprising an ethylene/chlorotrifluoroethylene layer, more particularly to multilayer assemblies having UV blocking properties, suitable for being exposed to UV radiations.

BACKGROUND ART

Ethylene/chlorotrifluoroethylene polymers have been widely used for manufacturing protective and packaging films and coatings, due to their outstanding transparency, weatherability and mechanical properties.

It also often happens that pigments or additives or, more broadly, compounds comprising Titanium are embedded in ethylene/chlorotrifluoroethylene polymers used for fabricating said films or coatings; $TiO_2$ compounds, for instance, have been found particularly useful as UV-blockers and are thus the material of choice when opacity to UV rays is required.

Now, photocatalytic activity of Ti compounds is a well recognized phenomenon which might impair stability of the polymer matrix and thus depriving films or coatings from acceptable long term properties, including optical properties, mechanical properties.

While titanium oxide additives are thus widely incorporated in said polymer matrix once coated/modified on their surface by means of inert layers, these coatings are nevertheless not completely effective for totally depressing degradation catalysis and acid chloride generation from ethylene/chlorotrifluoroethylene polymers, so that films and coatings generally undergo yellowing phenomena, transparency and haze quickly being affected, as well as mechanical properties. This problem particularly appears when the ethylene/chlorotrifluoroethylene polymer films are intended for prolonged exposure to sun light and environment conditions, e.g. when these films are used as protective front films in PV cell modules.

There is thus a current shortfall in the art for ethylene/chlorotrifluoroethylene polymer structures comprising titanium compounds, which could withstand exposure to UV and VIS light and to weather wet and dry conditions, without undergoing significant degradation, and thus while maintain their original properties, including optical and mechanical properties.

Examples of multilayer structures comprising a ECTFE layer containing a Ti compound are known.

Thus, document EP 1281730 A (AUSIMONT SPA) May 2, 2003 discloses a multilayer coating for metal substrates, wherein a first layer comprising a ECTFE resin, possibly comprising a filler (mica, metal oxide, inorganic pigments) is further overcoated with a further layer of another ECTFE polymer generally comprising a modifier comonomer, thus reducing its crystallinity. Example 3 of this application thus discloses a multilayer structure wherein a layer comprising an ECTFE polymer containing 3% wt of a mica pigment additive coated with $TiO_2$ is adhered to a metal substrate and is overcoated with a terpolymer of ethylene (E), chlorotrifluoroethylene (CTFE), perfluoropropylvinylether (PFPVE) having a melting point of 221° C.; test carried out by the Applicant have confirmed that this material possesses a low crystallinity.

SUMMARY OF INVENTION

Figure 1:
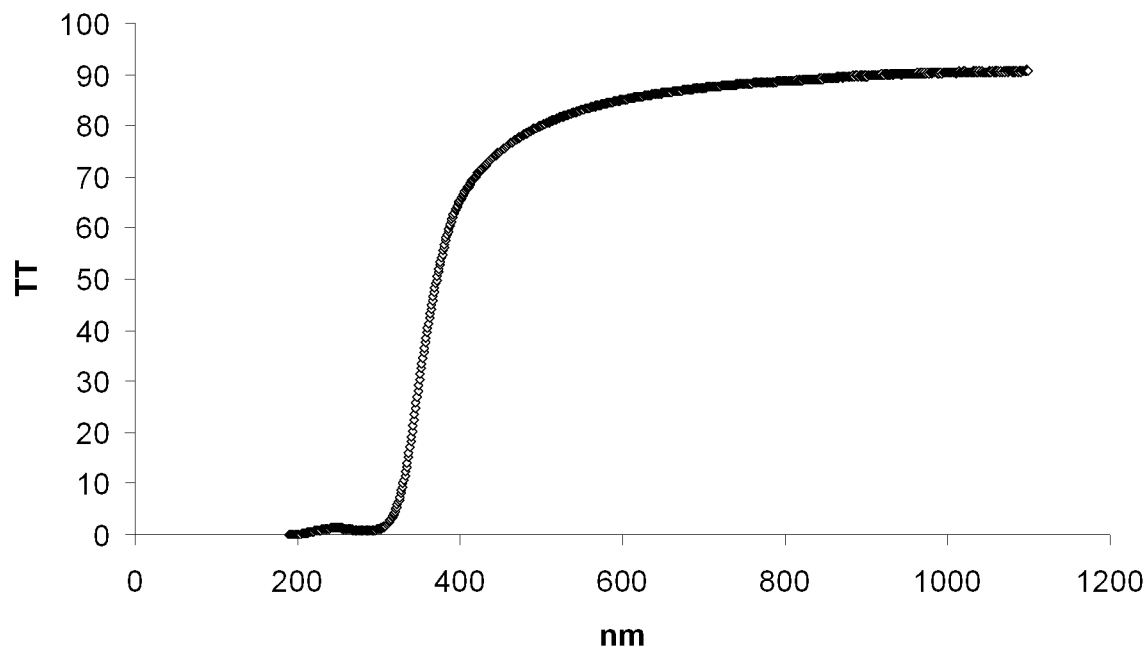
FIG. 1 shows UV-Visible transmittance (in %) as a function of the wavelength (in nm), measured by Perkin Elmer Lambda 6 spectrophotometer, recorded on the multilayer assembly ECTFE-1//(ECTFE-2+UV blocker)//ECTFE-1 of example 1, said ECTFE-1 having a heat of fusion of at least 35 J/g.

The invention thus pertains to a multilayer assembly comprising:

(L1) a first inner layer [layer (L1)] made from a first composition [composition (C1)], said composition (C1) comprising:
  at least one polymer comprising recurring units derived from ethylene (E) and from chlorotrifluoroethylene (CTFE), and
  at least one Ti compound; and
(L2) a second outer layer [layer (L2)] made from a second composition [composition (C2)], said composition (C2) being substantially free from $TiO_2$-containing additives, said second composition comprising at least one semi-crystalline polymer comprising recurring units derived from ethylene and from at least one fluoromonomer selected from chlorotrifluoroethylene (CTFE), tetrafluoroethylene (TFE) and mixtures thereof, said semi-crystalline polymer having a heat of fusion of at least 35 J/g [polymer (A)].

The Applicant has surprisingly found that when an ECTFE polymer first layer comprising a Ti compound is assembled with a second layer made from a high crystalline fluoropolymer, as above detailed, the weather-induced degradation of the first layer is substantially inhibited.

The Applicant thinks, without being bound by this theory, that the presence of a high crystalline layer significantly reduce permeation and penetration of environmental moisture and/or oxygen through said layer into the ECTFE layer comprising the Ti compound, this penetrated and permeated water and/or oxygen being major responsible for generation of radicals upon exposure to UV rays, and thus attacks to the ECTFE polymer matrix, in particular to the C—Cl bonds.

The heat of fusion of polymer (A) is determined by Differential Scanning calorimetry (DSC) at a heating rate of 10° C./min, according to ASTM D 3418.

Polymer (A) possesses a heat of fusion of at least 35 J/g, preferably of at least 37 J/g, more preferably of at least 40 J/g.

Without upper limit for heat of fusion being critical, it is nevertheless understood that polymer (A) will generally possess a heat of fusion of at most 55 J/g, preferably of at most 53 J/g, more preferably of at most 50 J/g.

It is well known in the art that 50/50 mol/mol ECTFE or ETFE copolymers show a maximum of crystallinity, i.e. of both melting point and heat of fusion. The requirement for a heat of fusion of at least 35 J/g can thus be achieved in the compositional range around 50/50 molar ratios in both ECTFE and ETFE copolymers, or by very slightly increasing or by very slightly decreasing the amount of ethylene with respect to this 50/50 molar ratio.

Polymer (A) of the composition (C2) of the invention typically comprise:
(a) from 45 to 55%, preferably from 47 to 53% by moles of ethylene (E);
(b) from 55 to 45%, preferably from 53 to 47% by moles of chlorotrifluoroethylene (CTFE), tetrafluoroethylene (TFE) or mixture thereof; and
(c) from 0 to 5%, preferably from 0 to 2.5% by moles, based on the total amount of monomers (a) and (b), of one or more fluorinated and/or hydrogenated comonomer(s).

Preferably the comonomer (c) is a hydrogenated comonomer selected from the group of the acrylic monomers as above defined. More preferably the hydrogenated comonomer is selected from the group of the hydroxyalkylacrylate comonomers, such as hydroxyethylacrylate, hydroxypropylacrylate and (hydroxy)ethylhexylacrylate.

Nevertheless, polymers (A), as above detailed, free from comonomers (c) will be preferred.

Among polymers (A), ECTFE copolymers, i.e. copolymers of ethylene and CTFE (and optionally a third monomer, as above detailed) are preferred.

ECTFE polymers suitable in the composition of the invention typically possess a melting temperature exceeding 220° C., preferably exceeding 225° C., even exceeding 230° C., preferably exceeding 235° C. The melting temperature is determined by Differential Scanning calorimetry (DSC) at a heating rate of 10° C./min, according to ASTM D 3418.

ECTFE polymers which have been found to give particularly good results in the composition (C2) of the assembly of the invention are those consisting essentially of recurring units derived from:
(a) from 48 to 52% by moles of ethylene (E);
(b) from 52 to 48% by moles of chlorotrifluoroethylene (CTFE).

End chains, defects or minor amounts of monomer impurities leading to recurring units different from those above mentioned can be still comprised in the preferred ECTFE, without this affecting properties of the material.

The melt flow rate of the ECTFE polymer, measured following the procedure of ASTM 3275-81 at 230° C. and 2.16 Kg, ranges generally from 0.01 to 75 g/10 min, preferably from 0.1 to 50 g/10 min, more preferably from 0.5 to 30 g/10 min.

Composition (C2) is substantially free from $TiO_2$-containing additives; this expression is intended to mean that no $TiO_2$-containing additive is present in an effective amount to provoke UV-catalyzed degradation phenomena. This typically correspond to an amount of $TiO_2$-containing additive of less than 0.1% wt, preferably less than 0.05% wt, more preferably of less than 0.01% wt, with respect to the weight of polymer (A).

Composition (C2) can possibly comprise another thermoplastic polymer in addition to polymer (A). The choice of this additional thermoplastic polymer is not particularly limited; fluoropolymers and hydrogenated polymers can be used. Generally, these additional components will be used in minor amounts with respect to polymer (A).

According to certain embodiments, composition (C2) will comprise polymer (A), as above described, in admixture with at least one other semi-crystalline polymer comprising recurring units derived from ethylene and from at least one fluoromonomer selected from chlorotrifluoroethylene (CTFE), tetrafluoroethylene (TFE) and mixtures thereof, said semi-crystalline polymer having a heat of fusion of less than 35 J/g [polymer (B)].

According to this embodiment, composition (C2) will generally comprise polymer (A) as major component, while polymer (B) will be comprised in minor amount, so as not to detrimentally affect the barrier properties of layer (L2); typical amounts will range among 5 to 25% wt, with respect to the weight of polymer (A).

Preferred embodiments are nevertheless those wherein polymer (A) is the sole polymer component of composition (C2).

Composition (C2) optionally can further comprise filling materials, electrically conductive particles, lubricating agents, heat stabilizer, antistatic agents, extenders, reinforcing agents, organic and/or inorganic pigments, acid scavengers, such as MgO, flame-retardants, smoke-suppressing agents and the like.

By way of non-limiting examples of filling material, mention may be made of mica, alumina, talc, carbon black, glass fibers, carbon fibers, graphite in the form of fibers or of powder, carbonates such as calcium carbonate.

It is generally preferred for layer (L2) to be transparent, that is to say to possess a total transmittance of more than 80%, preferably more than 85%, even more preferably more than 92% when determined on layer (L2) having a thickness of about 50 µm, when measured according to ASTM D 1003 standard in air.

It is understood that total trasmittance of layer (L2) can be determined according to ASTM D1003 both in air and in water. In this latter case, the specimen to be measured is typically placed in a quartz vial filled with deionized water.

Thus, when measured in water, total transmittance of layer (L2) is generally of at least 85%, more preferably of at least 90%, even more preferably of at least 94%.

To this aim, composition (C2) is advantageously substantially free from filling materials having average particle size of 100 nm or more. Typically, composition (C2) will be totally free from filling materials of whichever size, as above detailed.

Thickness of layer (L2) is not particularly limited; it is nevertheless understood that layer (L2) will possess a thickness of at least 5 µm, preferably of at least 10 µm, more preferably of at least 12.5 µm. Layers (L2) having thickness of less than 5 µm, while still suitable for the multilayer assembly of the invention, will not be used when adequate mechanical resistance is required.

As per the upper limit of thickness of layer (L2), this is not particularly limited, provided that said layer (L2) still can provide the flexibility and transparency required for the particular field of use targeted.

For use of the multilayer assembly for protection of PV cell modules, layers (L2) having a thickness of at most 150 µm, preferably of at most 100 µm, even more preferably 50 µm will be advantageously used.

Layer (L1) of the multilayer assembly of the invention is made from composition (C1) comprising:
at least one polymer comprising recurring units derived from ethylene (E) and from chlorotrifluoroethylene (CTFE), and
at least one Ti compound.

The ECTFE polymer of composition (C1) typically comprise:

(a) from 10 to 90%, preferably from 30 to 70 by moles of ethylene (E);
(b) from 90 to 10%, preferably from 70 to 30%, by moles of chlorotrifluoroethylene (CTFE); and
(c) from 0 to 30%, preferably from 0.1 to 15% by moles, based on the total amount of monomers (a) and (b), of one or more fluorinated and/or hydrogenated comonomer(s).

Non limiting examples of fluorinated comonomers are for instance perfluoroalkylvinylethers, perfluoroalkylethylenes (such as perfluorobutylethylene), perfluorodioxoles, vinylidenefluoride. Among them, the preferred comonomer is perfluoropropylvinylether of formula $CF_2=CFO-C_3F_7$.

Non limiting examples of hydrogenated comonomers, are those having the general formula: $CH_2=CH-(CH_2)_nR_1$ wherein $R_1=OR_2$, or $-(O)_tCO(O)_pR_2$ wherein t and p are integers equal to 0 or 1 and $R_2$ is H or a hydrogenated linear or branched alkyl or cycloalkyl radical having from 1 to 20 carbon atoms, optionally containing heteroatoms and/or chlorine atoms, the heteroatoms preferably being O or N; $R_2$ optionally contains one or more functional groups, preferably selected from OH, COOH, epoxide, ester and ether, $R_2$ may optionally contain double bonds; n is an integer in the range 0-10. Preferably $R_2$ is an alkyl radical having from 1 to 10 carbon atoms containing hydroxyl functional groups and n is an integer in the range 0-5.

Preferred hydrogenated comonomers are selected from the following classes:
- acrylic monomers having the general formula: $CH_2=CH-CO-O-R_2$, wherein $R_2$ is selected from ethylacrylate, n-butylacrylate, acrylic acid, hydroxyalkylacrylates, such as hydroxyethylacrylate, hydroxypropylacrylate, (hydroxy)ethylhexylacrylate;
- vinylether monomers having the general formula: $CH_2=CH-O-R_2$, wherein $R_2$ is selected from propylvinylether, cyclohexylvinylether, vinyl-4-hydroxybutylether;
- vinyl monomers of the carboxylic acid having the general formula: $CH_2=CH-O-CO-R_2$, wherein $R_2$ is selected from vinyl acetate, vinyl propionate, vinyl-2-ethylhexanoate;
- unsaturated carboxylic acid monomers having the general formula: $CH_2=CH-(CH_2)_n-COOH$, wherein n has the above mentioned meaning, for instance vinylacetic acid.

The ECTFE polymer of composition (C1) can possess a heat of fusion, as determined by Differential Scanning calorimetry (DSC) at a heating rate of 10° C./min, according to ASTM D 3418, above, equal or below 35 J/g. In other words, crystalline fraction of ECTFE polymer of composition (C1) is nota particularly critical.

Nevertheless, ECTFE polymers having low crystallinity, i.e. having heat of fusion of less than 35 J/g, preferably of less than 30 J/g, more preferably of less than 25 J/g will be preferred when aiming at maximizing dispersion ability of nanosized fillers therein.

It is thus understood that ECTFE polymers which are preferred for composition (C1) are indeed those comprising an amount of recurring units derived from ethylene of less than 50% moles, preferably of less than 48% moles, more preferably of less than 45% moles, as they enable achieving improved properties due to the fluoromonomer components.

Composition (C1) thus preferably comprises an ECTFE polymer containing:
(a) from 30 to 48%, preferably from 35 to 45% by moles of ethylene (E);
(b) from 52 to 70%, preferably from 55 to 65% by moles of chlorotrifluoroethylene (CTFE); and
(c) from 0 to 5%, preferably from 0 to 2.5% by moles, based on the total amount of monomers (a) and (b), of one or more fluorinated and/or hydrogenated comonomer(s), as above detailed.

ECTFE polymers which have been found to give particularly good results in composition (C1) are those consisting essentially of recurring units derived from:
(a) from 35 to 47% by moles of ethylene (E);
(b) from 53 to 65% by moles of chlorotrifluoroethylene (CTFE).

End chains, defects or minor amounts of monomer impurities leading to recurring units different from those above mentioned can be still comprised in the preferred ECTFE, without this affecting properties of the material.

As per the Ti compound is concerned, its selection will depend upon the particular functionality required to be ensured by this additive.

When the Ti compound is intended to behave as a UV blocker, inorganic compounds comprising $TiO_2$ will be typically preferred.

According to a first embodiment of the invention, the Ti compound is an inorganic UV blocker compound comprising $TiO_2$, and possibly comprising at least one other inorganic oxide compound.

Among preferred inorganic UV blocker compound comprising $TiO_2$ of this embodiment, mention can be made of particles comprising:
- a core consisting essentially of $TiO_2$; and
- a shell consisting essentially of at least one oxide of Si, Al or mixture thereof While the crystalline form of $TiO_2$ is not particularly limited, it is generally understood that rutile form of $TiO_2$ will be preferred over anatase form, to the aim of depressing photocatalytic activity and decomposition phenomena deriving therefrom.

Particles of this embodiment, as above detailed, may further comprises at least one other layer of a third material which can be the same of different from the materials of the core and of the shell. The particles may additionally comprise a further coating, either completely surrounding (e.g., encapsulating) or partially covering the particle, of a suitable coating additive, such as a dispersing agent, a stabilizer, an antistatic agent and the like. Coatings of organic dispersing agents have been found particularly useful, in particular those wherein stearates (esters and salts) are used.

Particles of this embodiment generally possess an average particle size of less than 150 nm, preferably less than 120 nm, more preferably less than 100 nm. Selection of particles having an average particle size of less than 150 nm is generally recommended for achieving transparency of layer (L1). Actually, provided that particles are used having sizes significantly smaller than the wavelength of visible light (typically from about 380 nm to about 850 nm), scattering is substantially reduced, so that visible light can penetrate and be transmitted ensuring thus transparency.

Layers (L1) made from composition (C1) containing an inorganic UV blocker compound comprising $TiO_2$ are particularly suitable for manufacturing multilayer assemblies intended as protective front sheet for PV cell modules.

Layers (L1) according to this embodiment typically possess a total transmittance of more than 85%, preferably more than 90%, even more preferably more than 92% when determined on layer (L2) having a thickness of about 50 μm, when measured according to ASTM D 1003 standard in air.

According to a second embodiment of the invention, the Ti compound is a pigment comprising $TiO_2$, possibly in combination with another inorganic oxide compound.

Pigmented composition (C1) will be selected for those fields of use wherein transparency is not required; nevertheless, colour stability and avoidance of degradation phenomena, yielding e.g. failures or loss in mechanical properties, still remain highly valuable also in these domains.

More generally, thickness of layer (L1) is not particularly limited; it is nevertheless understood that layer (L1) will possess a thickness of at least 15 µm, preferably of at least 20 µm, more preferably of at least 25 µm. Layers (L1) having thickness of less than 15 µm, while still suitable for the multilayer assembly of the invention, will not be used when adequate mechanical resistance is required.

As per the upper limit of thickness of layer (L1), this is not particularly limited, provided that said layer (L1) still can provide the flexibility and transparency required for the particular field of use targeted.

For use of the multilayer assembly for protection of PV cell modules, layers (L1) having a thickness of at most 125 µm, preferably of at most 100 µm, even more preferably 75 µm will be advantageously used.

Layer (L1) and layer (L2) are generally made to adhere to each other with no need of additional adhesive layer. It may nevertheless well be for an additional layer to be present among layer (L1) and layer (L2), without this falling outside the scope of the present invention.

Nevertheless, multilayer assemblies wherein layers (L1) and (L2) are joined directly are typically preferred.

The multilayer assembly may additionally comprise a third layer (L3), said layer adhering to layer (L1) on the opposite side of layer (L2).

Layout of the multilayer assembly of this embodiment will thus provide for a layer (L1), as above detailed, comprised between layer (L2), as above detailed, and layer (L3), equal to or different from layer (L2), made from a composition (C3).

While choice of layer (L3) is not particularly limited, embodiments which are particularly suitable to the purpose of the invention are those wherein layer (L3) is made from a composition (C3) possessing same features as composition (C2) as above detailed; preferably, composition (C3) of layer (L3) is identical to composition (C2) of layer (L2).

All features detailed above for layer (L2) can be provided for layer (L3) of this embodiment.

The invention also pertains to a method for manufacturing the multilayer assembly, as above detailed.

Use may be made of any usual techniques for assembling polymer layers to prepare the multilayer assemblies according to the invention.

An example of such techniques that may be mentioned includes those in which the compositions (C1), (C2) and optionally (C3) are used at a temperature at least equal to their softening point, typically at a temperature exceeding melting point of its polymer components. Preferably, the preparation of the multilayer assemblies according to the invention is performed by colaminating, coextrusion, for example coextrusion-laminating, coextrusion-blow moulding and coextrusion-moulding, extrusion-coating, coating, overinjection-moulding or coinjection-moulding.

The method for manufacturing the multilayer assemblies according to the invention is performed in a particularly preferred manner by colaminating, coextrusion or overinjection-moulding.

The choice of one or other of these assembly techniques is made on the basis of the use for which the multilayer assemblies are intended, as well as the thicknesses of each layers.

For example, multilayer assemblies intended for being used as pipes, tubes, films, sheets and plaques are preferably manufactured by coextrusion.

Thus, the method for manufacturing the multilayer assembly of the invention is preferably performed by coextrusion of a layer (L1), of a layer (L2) and optionally, of a layer (L3) as above detailed.

The thickness of multilayer assemblies according to the invention is not critical and obviously depends on the use for which said assemblies are intended.

The invention also relates to the use of the multilayer assemblies according to the invention for the manufacture of tubes, pipes, cladding, films, sheets, profiles, plaques and hollow bodies.

Multilayer assemblies comprising transparent layers, as above detailed, are particularly useful as architectural membranes, capstock, and for food and pharmaceutical packaging.

Further, in addition, according to a further embodiment of the present invention, a field of use which has been found particularly interesting for the multilayer assemblies of the present invention is the domain of protection of PV modules.

Thus, a method for protecting a PV module including covering said module with at least one multilayer assembly as above defined is still another aspect of the present invention.

According to this method, the multilayer assembly can be used for front or back protection of the PV cell module, front side being the side exposed to incident light. Multilayer assemblies comprising transparent layers, as above detailed, are particularly useful as front sheets in PV modules.

Also, multilayer assemblies of the invention have been successfully incorporated as protective layers for composite films having high water and oxygen barrier properties. Within this approach, the multilayer assemblies of the invention are generally further assembled onto polyethylene terephthalate (PET) or polyethylene naphthalate (PEN) films, wherein PET or PEN are preferably further coated with a thin layer of a high barrier material. Generally, this high barrier material is an inorganic material, preferably selected among silicon oxides, aluminium oxides or other mixed oxides which, advantageously, when coated e.g. via techniques like MOCVD, can provide coatings of 10 to 50 nm, preferably of 10 to 20 nm still ensuring transparency to visible radiation. Multilayer composite films can thus be obtained by adhering the multilayer assembly of the invention to the high barrier material layer coated onto the PET or PEN film through the use of an adhesive selected from epoxy or urethane glues. Assemblies comprising, from the outer layer to the inner layer, in the following order, a layer (L2), a layer (L1), optionally a layer (L3), an adhesive layer, a high barrier layer, and a PET or PEN layers are thus the preferred embodiments of this embodiment, enabling achievement of excellent oxygen and water vapour barrier [both generally of less than $10^{-2}$ g/(m²×day), when determined at 38° C. and 90% RH], combined with outstanding weatherability and transparency. Assemblies of this embodiment are particularly useful as protective layers for several organic/inorganic electronics devices, including, but not limited to, PV cells.

Assemblies of this embodiment are particularly suitable for the protection of active layers of PV cells which are particularly sensitive to oxygen and/or moisture. Among the PV cells of this type which are advantageously protected with the assemblies of this embodiment, mention can be made of active layers based on Copper Indium Gallium (di)Selenide (CIGS), Cadmium Telluride (CdTe) and organic photoactive compounds.

Should the disclosure of any patents, patent applications, and publications which are incorporated herein by reference conflict with the description of the present application to the extent that it may render a term unclear, the present description shall take precedence.

The invention will be now described in more detail with reference to the following examples, whose purpose is merely illustrative and not intended to limit the scope of the invention.

Raw Materials

Polymers

ECTFE-1 is a 50/50 mole % ethylene/chlorotrifluoroethylene (E/CTFE) copolymer commercially available under trade name HALAR® 500 having a melting point ($T_{m2}$) of 242° C. and a heat of fusion ($\Delta H_{2f}$) of 42 J/g and a MFI of 18 g/10 min (275° C./2.16 kg).

ECTFE-2: is a 41/59 mole % E/CTFE copolymer having a melting point ($T_{m2}$) of 180° C., a heat of fusion ($\Delta H_{2f}$) of 18 J/g and a MFI of 1.4 g/10 min (230° C./2.16 kg).

Ti-Containing Compound $TiO_2$-1 is a UV-blocker made of core-shell type particles having a core of $TiO_2$ coated with a shell of mixed $Al_2O_3$—$SiO_2$ oxide, these particles being surface treated with stearic acid, commercially available under trade name HOMBITEC® RM130F from Sachtleben Chemie GmbH, having an average particle size of 15 nm, available under the form of powder.

Manufacture of Polymer Compositions and Pelletization

The ECTFE-2 polymer, under the form of powder and the UV-blocker particles as above detailed were pre-mixed in a rapid mixer equipped with a three stages paddles mixer so as to obtain a homogeneous powder mixture having required weight ratio between mentioned ingredients.

No additive was included in ECTFE-1, which was also available as a powder.

Powder mixture of ECTFE-2 and UV-blocker and/or powder of ECTFE-1 was then processed by extrusion in a double screw 30-34 extruder (LEISTRITZ), equipped with 6 temperature zones and a 4 mm² holes die. Processing set points for ECTFE-1 and ECTFE-2-based composition, respectively, are summarized in Table 1 and Table 2.

ECTFE-1

TABLE 1

| Feed zone | T1 | T2 | T3 | T4 | T5 |
|---|---|---|---|---|---|
| 210 | 225 | 240 | 250 | 260 | 270 |

Screws speed was set at 300 rpm, with a torque of 49%, so as to yield a throughput rate of about 6 kg/h, and a melt extrudate temperature of 265° C.

ECTFE-2-Based Composition

TABLE 2

| Feed zone | T1 | T2 | T3 | T4 | T5 |
|---|---|---|---|---|---|
| 180 | 200 | 200 | 210 | 220 | 220 |

Screws speed was set at 300 rpm, with a torque of 59%, so as to yield a throughput rate of about 6.6 kg/h, and a melt temperature of 219° C.

Extruded strands were cooled in a water bath, dried, calibrated and cut in a pelletizer.

Example 1—Manufacture of Multilayer Assembly by Coextrusion

For manufacturing the multilayer assembly, pellets were processed in a coextrusion cast film line equipped with a 2.5" single stage extruder (A) and a with 2" satellite co-ex (B). Extruders are connected to the die via a feedblock equipped with a selector plug able to give the following layers' sequence: B/A/B (L2/L1/L3). The die was a 915 mm wide auto-gauge die. Upon exit from the die, molten tape was casted on three subsequent chill rolls, whose speed was adapted so as to obtain a film thickness of about 100 μm. Total thickness and thickness variation along the width are controlled by a Beta-ray gauge control system with retrofit to the die. The following processing conditions were used for a 100 μm thick film (25/50/25 μm as partial thickness sequence).

Extruder A was fed with pellets of composition of ECTFE-2 and UV-blocker, prepared as above detailed (for layer L1), while coextruder B was fed with pellets of ECTFE-1 (for layers L2 and L3). Both extruders were equipped with screen pack filters.

To obtain the desired thicknesses and ratio, extruders' and line speeds were set as follow:

Extruder A=>65 rpm
Extruder B=>70 rpm
Line speed=>12 m/min.

Extruder A temperatures' profile used in the example are summarized in Table 3:

TABLE 3

| Zone | Temperature (° C.) |
|---|---|
| Main Barrel Zone 1 | 255 |
| Main Barrel Zone 2 | 260 |
| Main Barrel Zone 3 | 260 |
| Main Barrel Zone 4 | 260 |
| Main Barrel Zone 5 | 260 |
| Clamp | 260 |
| Adapter 1 | 260 |
| Adapter 2 | 260 |

Extruder B temperatures' profile used in the examples are summarized in table 4:

TABLE 4

| Zone | Temperature (° C.) |
|---|---|
| Main Barrel Zone 1 | 275 |
| Main Barrel Zone 2 | 280 |
| Main Barrel Zone 3 | 280 |
| Main Barrel Zone 4 | 280 |
| Clamp | 280 |
| Adapter 1 | 280 |
| Adapter 2 | 280 |

Feedblock, die and calendering rolls temperatures are further detailed in Table 5:

TABLE 5

| Zone | Temperature (° C.) |
|---|---|
| Feedblock | 280 |
| Die Zone 1 | 285 |
| Die Zone 2 | 285 |
| Die Zone 3 | 285 |
| Die Zone 4 | 285 |
| Die Zone 5 | 285 |

TABLE 5-continued

| Zone | Temperature (° C.) |
|---|---|
| Top Roll | 90 |
| Center Roll | 170 |
| Bottom Roll | 170 |

Final width of the film, after edge cutting, was about 710 mm.

Characterization of the Multilayer Assembly

Multilayer assembly of example 1 was characterized for its optical properties according to ASTM D 1003 using a Gardner Haze-Gard Plus instrument. For evaluating spurious contributions possibly related to surface roughness or defects, specimens were analyzed in water, i.e. by immersing film samples in a quartz cell filled with water. A total transmittance of 94.7% and a haze value of 4.8 were determined, well demonstrating transparency and clearness of the multilayer assembly of the invention. FIG. 1 shows UV-Visible transmittance (in %) as a function of the wavelength (in nm), measured by Perkin Elmer Lambda 6 spectrophotometer, recorded on the multilayer assembly ECTFE-1//(ECTFE-2+UV blocker)//ECTFE-1 of example 1.

QUV-B Test—General Procedure

The QUV-B test method is a cyclic ultraviolet weathering procedure, in which layered articles are fixed in racks that face banks of fluorescent lamps, emitting UV radiation (namely UV-B 313 nm). This wavelength is known for being particularly aggressive in decomposing/degradating polymers; even if not abundant in natural sunlight, enables accelerated assessment of weatherability and UV-resistance.

During the tests, water is applied to the test samples by condensation, rather than by spray. To control the cyclic tests, the QUV is equipped with a variable interval timer that alternates the UV and the condensation at 50° C. followed by 8 hours UV radiation at 70° C. and high humidity. The QUV test as above mentioned was used for monitoring resistance to UV exposure and weather conditions of the multilayer assembly of the invention; total transmittance and haze were determined in water after various time exposures to QUV-B conditions and compared with initial values.

To the sake of comparison, a monolayer film made from composition ECTFE-2+UV blocker as above detailed, as well as a multilayer assembly ECTFE-2//(ECTFE-2+UV blocker)//ECTFE-2 were submitted to same test. All results are summarized in table herein below.

TABLE 6

| run | | T = 0 | 500 h QUV-B | 1 000 h QUV-B | 2 000 h QUV-B |
|---|---|---|---|---|---|
| ECTFE-2 + UV blocker bare film (comparative) | TT | 94.7 | 94.2 | 88.5 | n.d. |
| | haze | 3.4 | 7.7 | 19.1 | n.d. |
| Ex. 1 | TT | 94.7 | 95.2 | 94.4 | 94.1 |
| | haze | 4.8 | 4.5 | 5.8 | 7.2 |
| ECTFE-2// (ECTFE-2 + UV blocker)//ECTFE-2 (comparative) | TT | 94.7 | 94.5 | 93.4 | 92.9 |
| | haze | 4.6 | 5.8 | 8.8 | 16.9 |

Data provided in Table 6 well demonstrate that in the absence of the outer layer (L2), a film of an ECTFE polymer comprising a Ti compound is submitted to a quick degradation, yielding unacceptable values of haze (>10) and of TT (<90%) already after 500 hours exposure to QUV-B conditions.

Figure 2:
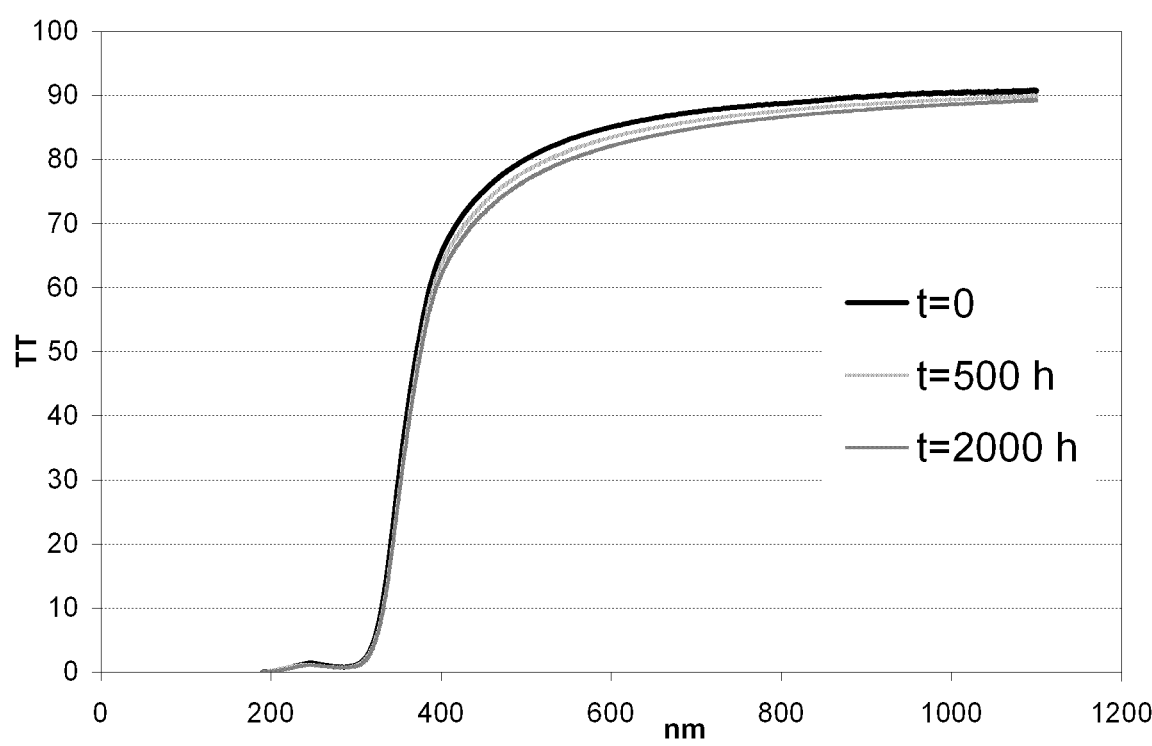
FIG. 2 thus depicts the TT (in %) as a function of wavelength (in nm) recorded for the assembly of example 1, as above detailed, before exposure to QUV-B conditions, and after 500 hours and after 2000 h of exposure to said conditions.

On the other side, the inclusion of a protective layer of a polymer (A) having a heat of fusion of at least 35 J/g can provide adequate protection to said inner film, so as both haze and TT remain at acceptable levels even after prolonged exposure to QUV-B conditions. In other words, the assembly remains transparent and clear and no significant change is detected in the absorption spectrum; FIG. 2 thus depicts the TT (in %) as a function of wavelength (in nm) recorded for the assembly of example 1 before exposure to QUV-B conditions, after 500 hours and after 2000 h: no appreciable difference in the optical behaviour can be discerned. Last example of comparison shows criticality of selection as protective layer of a polymer (A) having a heat of fusion of at least 35 J/g: in this case, wherein the protective layer is made from a polymer not complying with this requirement, optical properties of the assembly, in particular haze, undergo substantive degradation after 2000 hours of exposure to QUV-B.

The invention claimed is:

1. A multilayer assembly comprising:
a first inner layer (L1) made from a first composition (C1), said first composition (C1) comprising:
  at least one ECTFE polymer comprising recurring units derived from ethylene (E) and from chlorotrifluoroethylene (CTFE), said polymer's composition comprising:
    (a) from 35 to 47% by moles of E; and
    (b) from 53 to 65% by moles of CTFE, and
  at least one Ti compound that is an inorganic UV blocker compound consisting of particles comprising:
    a core consisting essentially of $TiO_2$, and
    a shell consisting essentially of at least one oxide of Si, Al or mixture thereof; and
a second outer layer (L2) made from a second composition (C2), said second composition (C2) being free from $TiO_2$-containing additives, said second composition (C2) comprising at least one semi-crystalline polymer (A) comprising recurring units derived from ethylene and from at least one fluoromonomer selected from chlorotrifluoroethylene (CTFE), tetrafluoroethylene (TFE) and mixtures thereof, said semi-crystalline polymer having a heat of fusion of at least 35 J/g, wherein the semi-crystalline polymer (A) of second composition (C2) consists essentially of:
  (a) from 48 to 52% by moles of ethylene (E); and
  (b) from 52 to 48% by moles of chlorotrifluoroethylene (CTFE).

2. The multilayer assembly of claim 1, wherein semi-crystalline polymer (A) of second composition (C2) is an ECTFE polymer possessing a melting temperature exceeding 220° C.

3. The multilayer assembly of claim 1, wherein the second composition (C2) comprises semi-crystalline polymer (A) as sole polymer component.

4. The multilayer assembly of claim 1, wherein layer (L2) has a thickness of at least 5 μm.

5. The multilayer assembly of claim 1, further comprising a third layer (L3) adhering to the first inner layer (L1) on the side opposite the second outer layer (L2).

6. The multilayer assembly of claim 5, wherein the third layer (L3) is made from a third composition (C3) identical to the second composition (C2).

7. A method for manufacturing the multilayer assembly of claim 1, the method comprising at least one technique selected from the group consisting of colaminating, coextruding, extrusion-coating, coating, overinjection-moulding and coinjection moulding.

8. A method for manufacturing tubes, pipes, cladding, films, sheets, profiles, plaques or hollow bodies, comprising using the multilayer assembly according to claim 1.

9. A method for protecting a PV module, the method comprising covering said module with at least one multilayer assembly according to claim 1.

10. A method for producing high barrier composite films, the method comprising adhering the multilayer assembly according to claim 1 onto a polyethylene terephthalate (PET) or polyethylene naphthalate (PEN) film through the use of an adhesive selected from epoxy or urethane glues.

11. The multilayer assembly of claim 1, wherein the ECTFE polymer of first composition (C1) has a heat of fusion of less than 35 J/g.

\* \* \* \* \*